(12) United States Patent
Fang et al.

(10) Patent No.: US 6,818,519 B2
(45) Date of Patent: Nov. 16, 2004

(54) METHOD OF FORMING ORGANIC SPACERS AND USING ORGANIC SPACERS TO FORM SEMICONDUCTOR DEVICE FEATURES

(75) Inventors: Sunfei Fang, LaGrangeville, NY (US); Lawrence Clevenger, LaGrangeville, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/252,753

(22) Filed: Sep. 23, 2002

(65) Prior Publication Data

US 2004/0058518 A1 Mar. 25, 2004

(51) Int. Cl.[7] .............................................. H01L 21/336
(52) U.S. Cl. ...................................... 438/301; 438/303
(58) Field of Search .................................. 438/197, 199, 438/217, 289, 290, 299, 301, 303, 201, 276, 279; 257/336, 334, 408, E29.278, E21.435

(56) References Cited

U.S. PATENT DOCUMENTS

| | | | |
|---|---|---|---|
| 4,745,086 A | | 5/1988 | Parrillo et al. |
| 4,994,404 A | * | 2/1991 | Sheng et al. ................. 438/297 |
| 5,405,791 A | | 4/1995 | Ahmad et al. |
| 5,670,401 A | * | 9/1997 | Tseng .......................... 438/291 |
| 5,719,089 A | | 2/1998 | Cherng et al. |
| 5,801,077 A | * | 9/1998 | Chor et al. ................... 438/305 |
| 5,861,343 A | | 1/1999 | Tseng |
| 5,866,448 A | | 2/1999 | Pradeep et al. |
| 5,989,966 A | * | 11/1999 | Huang ......................... 438/305 |
| 6,022,782 A | * | 2/2000 | Smith et al. ................. 438/303 |
| 6,103,563 A | | 8/2000 | Lukanc et al. |
| 6,103,588 A | | 8/2000 | Jeng et al. |
| 6,153,455 A | | 11/2000 | Ling et al. |
| 6,156,598 A | * | 12/2000 | Zhou et al. .................. 438/231 |
| 6,214,655 B1 | | 4/2001 | Lee et al. |
| 6,265,253 B1 | | 7/2001 | Lukanc et al. |
| 6,294,480 B1 | * | 9/2001 | Pradeep et al. ............. 438/763 |
| 6,495,430 B1 | * | 12/2002 | Tsai et al. ................... 438/424 |

FOREIGN PATENT DOCUMENTS

EP              945897 A1 *  9/1999    ......... H01L/21/312

* cited by examiner

Primary Examiner—George Fourson
Assistant Examiner—Brook Kebede
(74) Attorney, Agent, or Firm—Slater & Matsil, L.L.P.

(57) ABSTRACT

A method of forming organic spacers using an $N_2$ plasma or $N_2$ containing plasma anisotropic etchant, and using such organic spacers for forming features on a semiconductor structure such as vias having a smaller dimension than can be defined by lithographic techniques Other features formed according to the teachings of this invention include Source/Drain (S/D) areas, LDD/extension areas and graded junctions with larger S/D silicide/contact areas. The process for forming the organic spacers comprises conformally coating a patterned semiconductor structure with an organic material such as, for example, an antireflective coating. The coated structure is then anisotropically etched with $N_2$ plasma or $N_2$ containing plasma which forms the organic spacers. Organic spacers may be formed by the method of this invention or any other known method and used to form other device features such as (i) larger S/D contact areas, which may include graded junctions; and (ii) larger S/D contact areas and LDD/extensions, which may also include graded junctions with a single implant step.

12 Claims, 5 Drawing Sheets

METHOD OF FORMING ORGANIC SPACERS AND USING ORGANIC SPACERS TO FORM SEMICONDUCTOR DEVICE FEATURES

TECHNICAL FIELD

The present invention relates to a method of forming spacers suitable for forming larger S/D (Source/Drain) contact areas and LDD (lightly doped drain)/extension areas and graded junctions for semiconductor devices. More specifically, one embodiment of the invention relates to a method of forming disposable organic spacers using an $N_2$ plasma etch. Another embodiment of the invention is to use organic spacers as a method of forming semiconductor device features such as larger Source/Drain contact areas with a graded junction or Source/Drain and LDD/extension areas and graded junctions with a single implant step.

BACKGROUND

Formation of organic spacers typically occurs while anisotropic carrying out an etching of polysilicon through openings in a patterned photoresist mask with some formulation which includes one or more of C (carbon), H (hydrogen) and F (fluoride), i.e., $C_xH_yF_z$. Suitable formulation may include trifluoromethane ($CHF_3$) or carbon tetrafluoride ($CH_2F_2$), etc.

U.S. Pat. No. 5,719,089 issued to Meng-Jaw Cherng, et al. on Feb. 17, 1998 discusses the formation of polymer or organic spacers on sidewalls to reduce the size of contact openings in the PMD layer (polysilicon/metal dielectric) using a $C_xH_yF_z$ type plasma etch.

Likewise U.S. Pat. No. 5,861,343 issued to Horng-Haei Tseng on Jan. 19, 1999 also discusses a method of forming a self contact hole on a semiconductor substrate by using a patterned photoresist over a polysilicon layer. The polysilicon is then etched with an RIE process using a reactant gas such as $CH_2F_3$, $CF_4$, $C_2F_6$, $HB_r$ or $CH_2$ to produce the polymer sidewall spacers. The polymer sidewall spacers are then used as a mask to form an opening in the polysilicon layer of a reduce size.

U.S. Pat. No. 5,866,448 issued to Yelehanka R. Pradeepk et al. on Feb. 2, 1999 describes a method for fabricating an LDD area (lightly doped drain) for self aligned polysilicon gate MOSFET's. According to this patent, a polymer layer is formed along the sidewall of the gate during the patterning process of the gate electrode. This layer is then used to mask the S/D (Source/Drain) ion implantation and, according to the patent, provides improved thickness control as well as an improved sequence of process steps since this requirement for a spacer oxide layer is eliminated.

Another U.S. Pat. No. 6,103,588 issued to Erik S. Jeng on Aug. 15, 2000 also describes a method of forming a contact hole by anisotropic etching of a dielectric oxide layer which forms a spacer on the sidewalls to achieve features smaller than those defined by lithography.

Still other patents that may be considered relevant to the formation of Source/Drain areas and graded junctions include U.S. Pat. Nos. 4,745,086; 5,405,791; 6,103,563; 6,153,455; 6,214,655 and 6,265,253.

SUMMARY OF THE INVENTION

An improved method for forming organic spacers and of using organic spacers for forming larger S/D contact areas, LDD/extension areas and the formation of graded junctions with fewer process steps is provided by the present invention. One embodiment of this invention is a method of forming organic spacers. The method comprises providing a patterned semiconductor structure which is then conformally coated with an organic material such as, for example only, an antireflective coating. The patterned semiconductor structure coated with the organic material is then anisotropically etched with $N_2$ plasma or "$N_2$ containing plasma". "$N_2$ containing plasma" as used herein is defined as $N_2$, which also includes a carrier gas such as, for example, Argon or Helium.

According to another embodiment for forming openings such as a contact via, the step off providing the patterned semiconductor structure is followed by conformally coating the patterned structure with organic material. The anisotropic etching step with $N_2$ plasma of this coated structure forms organic spacers on the sidewall of the etched aperture in the coated area so that further etching through the patterned semiconductor structure results in a opening with reduced size. This reduced diameter hole or aperture may then be filled with conductive material.

According to still another embodiment, the invention provides for manufacturing of semiconductor devices with a larger S/D contact area and/or an LDD/extension area, which may include graded junctions with a single implant step. The method of this embodiment of the invention comprises the steps of forming a gate dielectric such as a gate oxide and conductive gate structures. And organic spacers are formed on the sidewall of the conductive gate member. The organic spacers can be formed by the method of this invention or any other known method although the method of this invention is believed to be especially effective. These organic sidewall spacers are then used as a mask to form S/D regions, and LDD/extension areas, which may include enhanced graded junctions. These features may be formed in a single implant step. After forming the S/D region and LDD/extension areas with or without enhanced graded junctions, the organic spacer is stripped and a thinner normal permanent spacer may be formed to provide for larger S/D contact area. Still another embodiment of fanning larger S/D contact areas, which may include graded junctions comprises the steps of forming a gate dielectric such as a gate oxide and conductive gate structures. Thin permanent spacers are then formed over the conductive gate structures. Organic spacers are then formed over the thin permanent spacer by the method of this invention or any other known method. An implanted is performed to form the S/D regions and may include graded junctions. The organic spacers are then stripped to provide larger S/D contact areas.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Semiconductor device dimensions have been continuously scaled down over the past two decades. The more the dimensions are scaled down, the faster the speed of the device, the higher the package density, and the lower the power dissipation. Therefore, it is a great competitive advantage and it is important to achieve smaller dimensions then is possible with existing lithographic techniques. However, when the dimensions are scaled down, the Source/Drain contact resistance goes up that may degrade device performance. Therefore, it is highly desirable to form larger Source/Drain contact areas while at the same time scaling down other device dimensions. Also, the formation of graded junctions can improve the short channel effect resulting from scaling down the dimensions of the device. This invention discloses methods to solve or improve all above concerns.

Certain anisotropic etching processing leaves a layer of polymer material on sidewall surfaces around the area subjected to the etching process. Although the formation of such polymer layers may have originally been an undesirable result, the formation of such layers can be used to obtain or form specific features on a semiconductor device. More specifically, the formation of these polymer layers (or spacers) on sidewalls allows etching of vias or openings which are substantially smaller in cross-section than can otherwise be achieved. U.S. Pat. Nos. 5,719,089; 5,861,343 and 6,103,588 discussed above, provide examples of forming smaller openings or vias. Further, as described in U.S. Pat. No. 5,866,448 such polymer layers can also be used as a mask during ion implantation to aid in the formation of Source/Drain regions in a semiconductor device.

Figure 1A:
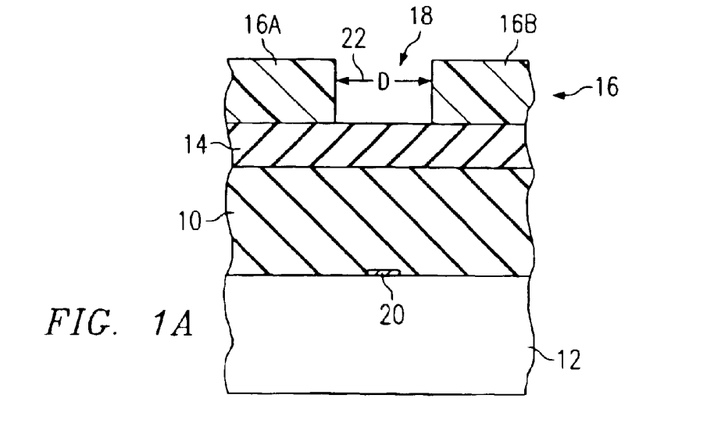
FIGS. 1A, 1B, and 1C illustrate a prior art process for forming polymer spacers on a semiconductor device.
Figure 1B:
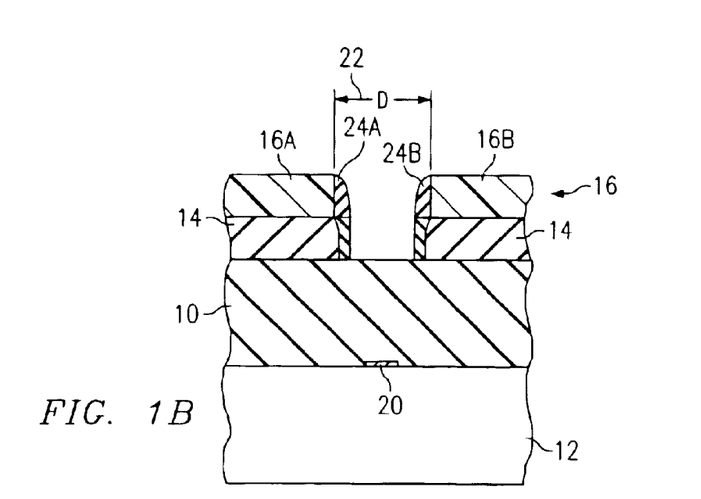
Figure 1C:
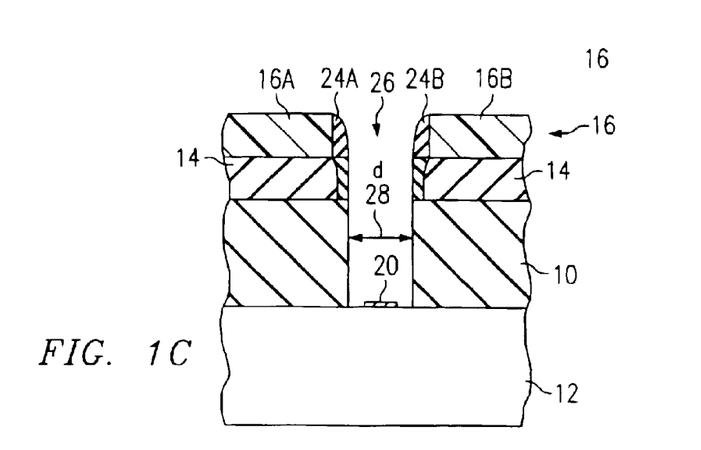

Referring now to FIGS. 1A, 1B and 1C, there is illustrated a prior art technique or method for forming an opening or via having a substantially smaller dimension than can be achieved by normal patterning of a photoresist followed by anisotropic etching. As shown in FIG. 1A, an insulating or dielectric layer 10 covers a substrate 12 such as a silicon wafer. The dielectric layer 10 may be any suitable oxide such as a $SiO_2$, a PMD dielectric (pre-metal dielectric) or other low flow temperature doped oxide such as boronphosilicate glass (BPSG). A polysilicon or silicon nitride layer 14 is then deposited over the dielectric layer 10. A layer of photoresist such as shown at 16 is then patterned to define areas of 16A and 16B and opening 18.

In the example illustrated in FIGS. 1A, 1B and 1C, it is intended to form an opening or via through nitride or poly layer 14 and the dielectric layer 10 to a contact area 20 on the substrate or other device structure 12. Also as shown, the size of the opening 18 has a dimension "D" indicated by the double-headed arrow 22. The dimension "D" as an example, may represent the minimum practical dimension that can be obtained with available photoresist and lithographic techniques. When the device dimensions are reduced, device performance increases and manufacturing costs go down. A competitive advantage is achieved by forming device feature sizes smaller than is now possible by existing lithographic techniques.

Therefore, referring now to FIG. 1B, and according to the prior art, it is found that subjecting the patterned semiconductor structure to a mixed chemistry anisotropic plasma etch, using for example a $C_xH_yF_z$ formulation (carbon, hydrogen and fluoride) along with $O_2$ results in the formation of non-volatile polymer spacers 24A and 24B when the poly or nitride layer 14 is etched. Examples of $C_xH_yF_z$ formulations are trifluoromethane or carbon tetrafluoride.

The polymer spacers 24A and 24B now act as a mask such that continued etching of the dielectric layer 10 results in a via or opening 26 through the dielectric layer 10 having a substantially reduced cross-section dimension "d" as indicated by the reference numeral 28 in FIG. 1C. The patterned layer of photoresist 16 along with the poly or nitride layer 14 is then stripped from the dielectric layer 10. The via 26 can subsequently be filled with a conductive material to provide a conductive path to the semiconductor area 20 according to methods well known to those skilled in the art.

Figure 2A:
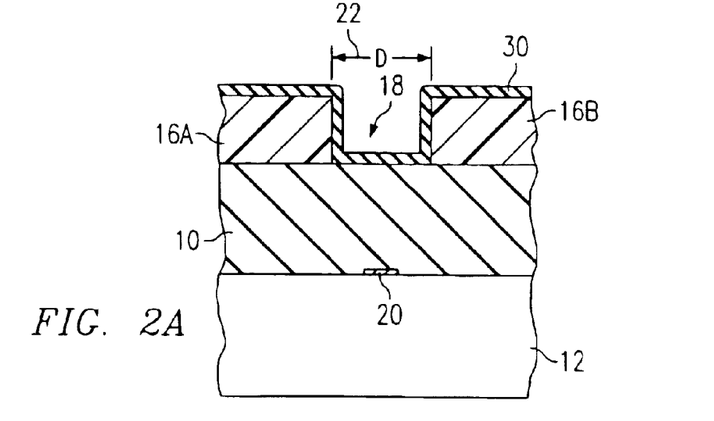
FIGS. 2A, 2B, and 2C illustrate a process of the present invention for forming organic spacers on a semiconductor device with $N_2$ plasma.
Figure 2B:
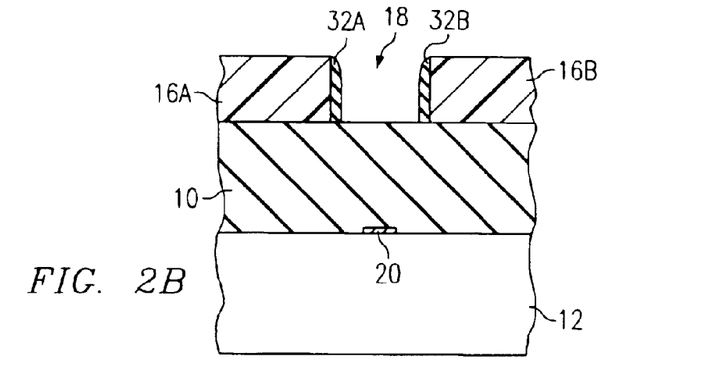
Figure 2C:
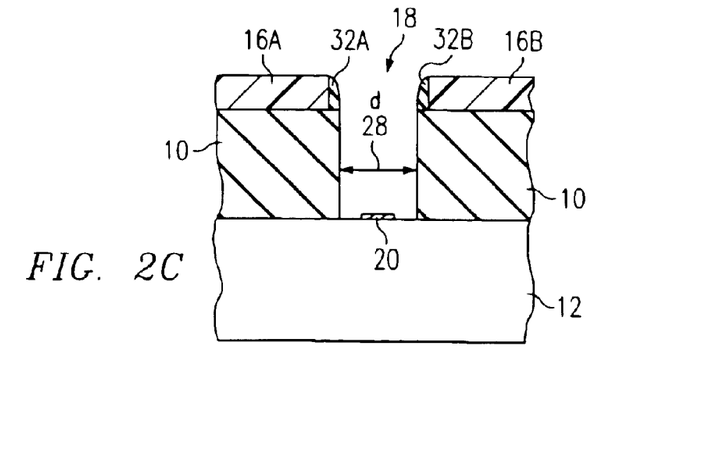

Referring now to FIGS. 2A, 2B and 2C, there is illustrated the process for forming an organic spacer according to the present invention, which, in the illustrated example, is used to reduce the size of a via or opening as discussed above. However, it should be understood that organic spacers can also be used for forming other features of semiconductor devices as will be discussed later.

As shown in FIG. 2A, a layer 10 of dielectric material covers a semiconductor substrate such as a silicon wafer 12. A patterned layer of photoresist is then formed over the dielectric layer 10 in the same manner as discussed above. It should be noted, however, that unlike the prior art process discussed with respect to FIGS. 1A, 1B and 1C, a nitride or poly layer is not required. A conformal coating 30 of organic material such as, for example, an anti-reflecting coating material is then applied over the patterned layer of photoresist. The anti-reflecting coating material AR3, available from the Shipley Company in the state of Massachusetts, has been found effective with the present invention. Also, assuming again that it is desired to provide a conductive path from the top of the dielectric layer 10 to a contact area 20 on the substrate or wafer 12, a via or opening must be provided through the dielectric to contact area 20.

Therefore, referring to FIG. 2B, the patterned semiconductor structure with the organic coating is then subjected to an anisotropic plasma etch in a plasma etcher. However, unlike the prior art, the plasma etch is comprised only of $N_2$ plasma or "$N_2$ containing plasma", such as, for example, $N_2/Ar$ (argon) plasma or $N_2/He$ (helium) plasma.

Tests using the $N_2$ plasma with the organic coating according to this invention indicate the process is very effective. For example, the "lateral" etch rate for organic material using an $N_2$ plasma is negligible and limited to around 2 nm/min for all plasma power levels as indicated by Table 1 below. This negligible lateral etch is caused by neutral radicals in $N_2$ plasma. Table 1 illustrates that neutral radicals in remote $N_2$ plasma has a negligible etch rate for organic material.

TABLE 1

Isotropic (lateral) Etch Rate with a remote $N_2$ Plasma

| Plasma Power (W) | Etch Rate (nm/min) |
|---|---|
| 500 | 2.3 |
| 700 | 2.1 |
| 900 | 1.8 |

On the other hand, the "vertical" etch rate increases significantly with ion enhancement when the etching bias is varied in a normal plasma etcher. For example, in Table 2 below it is seen from lines 1 and 2 of the table that the etch rate for organic material is increased significantly. Unlike in a remote plasma system, a self bias exists on the wafer in a normal plasma system when the wafer is directly exposed to plasma. Therefore, even at an RF bias of 0 watt, the etch rate is over 20 times of that in a remote $N_2$ plasma. When the RF bias is increased to 500 watts, an increase of almost an additional 10-fold occurs. For $N_2$ containing plasma, a similar etch rate is also observed as shown in Table 2.

TABLE 2

Anisotropic (vertical) Etch Rate with $N_2/Ar$ Plasma

| RF Bias (W) | Etch Chemistry (sc cm) | Etch Rate (nm/min) |
|---|---|---|
| 0 | $N_2$: 100 | 45 |
| 300 | $N_2$: 100 | 307 |
| 0 | $Ar/N_2$: 100/20 | 32 |
| 100 | $Ar/N_2$: 100/20 | 128 |
| 300 | $Ar/N_2$: 100/20 | 271 |
| 500 | $Ar/N_2$: 100/20 | 347 |

Tables 1, and 2 show that the etch rate for organic material in the lateral direction in $N_2$ plasma and "$N_2$ containing plasma" is almost negligible, and the etch rate in vertical direction is greatly enhanced by bias power of plasma. The etch rate for organic material in vertical direction is more than 100 fold faster than that in lateral direction with a bias power of 300W. Thus, $N_2$ plasma or $N_2$ containing plasma is a very effective an-isotropic etchant for organic material.

As shown in FIG. 2B, anisotropic $N_2$ plasma etching of the organic coating 30 results in organic spacers 32A and 32B forming on the sidewalls of the patterned photoresist layer 12.

Therefore, according to another embodiment of this invention, formed organic spacers 32A and 32B act as a mask so that continuing an-isotropic dielectric etch of layer 10 results in an opening or via having a reduced size "d" to the contact area 20, as shown in FIG. 2C. A conductive material can now be used to fill the small diameter via to provide a path from area 20 through dielectric layer 10.

The organic spacer formed by the method disclosed in this invention can also be used to form other device structures, such as larger S/D contact area and graded junction as will be discussed below.

Figure 3:
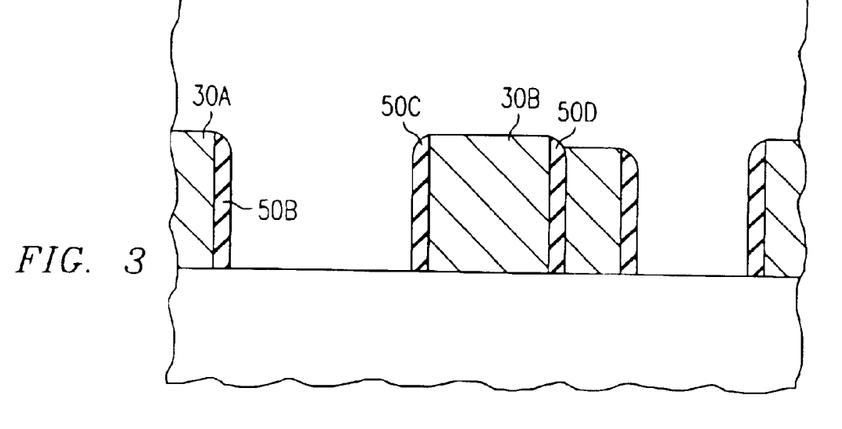
FIG. 3 is a copy of an actual Scanning Electron Microscope (SEM) photograph of organic spacers formed according to the method of the present invention.

The reproduction of an actual SEM photograph (Scanning Electron Microscope) of organic spacers produced according to the teachings of the present invention with $N_2$ plasma is illustrated in FIG. 3.

As discussed above, in addition to reducing the size of an opening or via, organic spacers may be used to form enlarged Source/Drain (S/D) contact areas, LDD (lightly doped drain)/extension areas with or without graded junctions. Further, these features may be formed with a single implant step.

Figure 4A:
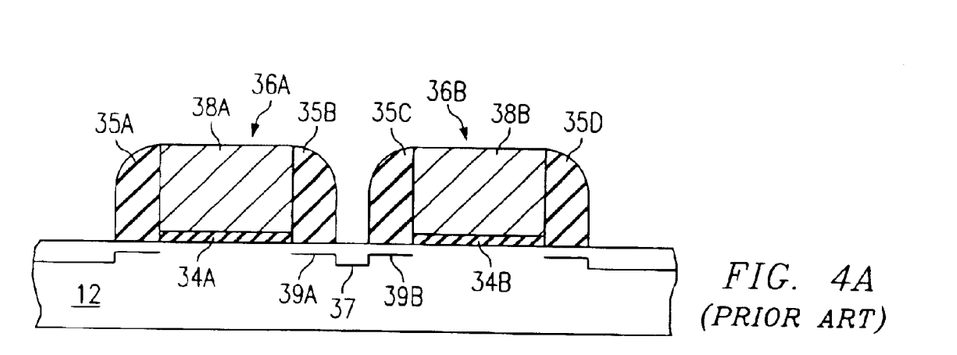
FIGS. 4A and 4B illustrate a prior art method of using polysilicon or dielectric-based disposal spacers for forming larger Source/Drain contact areas.
Figure 4B:
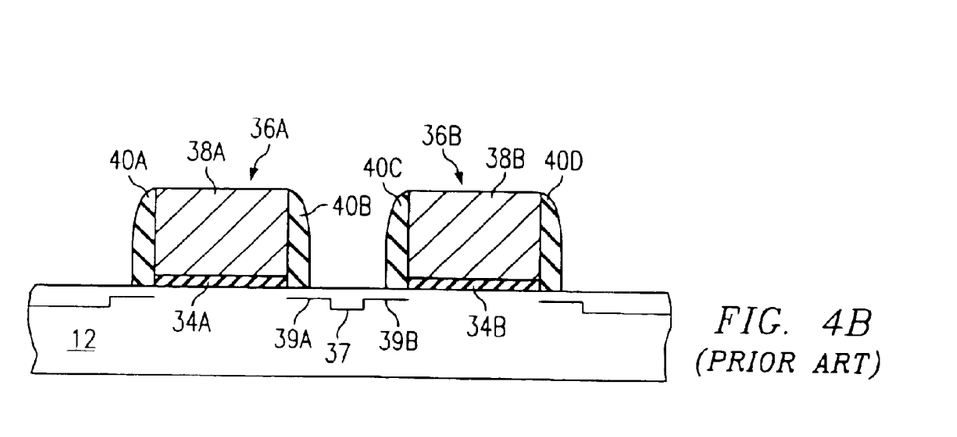

Referring now to FIGS. 4A and 4B, there is shown a prior art method of using disposable spacers to obtain larger S/D contact areas. As shown in FIG. 4A, a gate dielectric layer such as a gate oxide is deposited over a semiconductor substrate such as a silicon wafer 12. A conductive material 38, such as polysilicon, is then deposited over the gate dielectric. The conductive gate stack is then patterned and etched to define gate structure 36A, 36B. An ion implant is performed to form LDD/extension area 39A and 39B.

After the conductive gates 38A and 38B and LDD/extension areas 39A and 39B have been formed, thick disposable spacers 35A, 35B, 35C and 35D made of such materials as polysilicon, silicon oxide or silicon nitride are then formed on the sidewalls of the conductive gates. The S/D junction 37 is then formed by ion implantation according to methods known to those skilled in the art, as shown in FIG. 4A. The thick disposable spacers 35A–35D are then removed and smaller permanent spacers 40A, 40B, 40C and 40D are formed to provide larger S/D contact areas, as shown in FIG. 4B. It should be noted that this process will not produce graded junctions. It should also be appreciated that the removal of the disposable spacers 35A–35D typically requires a process such as, for example, a dry etch that is damaging to the underlying semiconductor structure such as the gate oxide and/or S/D junctions.

Figure 5:
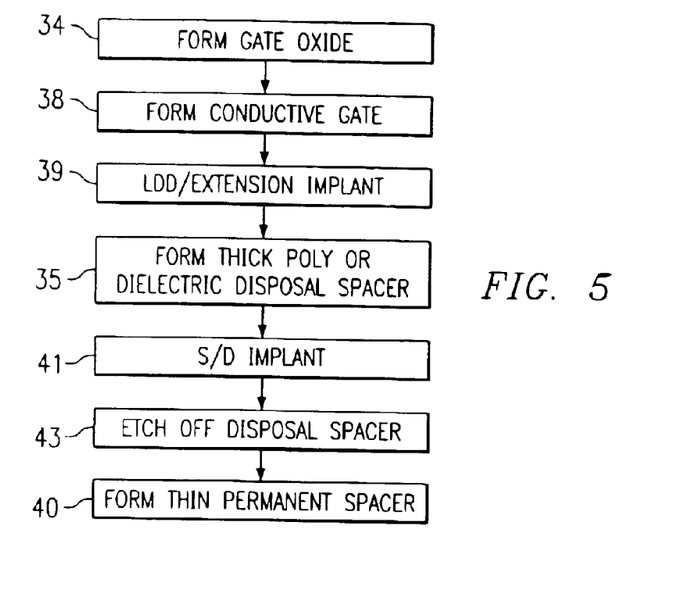
FIG. 5 is a process flow diagram for forming the structures shown in FIGS. 4A and 4B.

A flow diagram for forming the prior art structures illustrated in FIGS. 4A and 4B is shown in prior art FIG. 5. As shown, a gate dielectric such as oxide is formed over the substrate 12 as indicated by step 34. Conductive gates 38A and 38B are formed over the gate oxide as shown at step 38. The LDD/extensions 39A and 39B are then implanted into the substrate 12 as indicated at step 39. The thick poly or dielectric disposable spacers 35A, 35B, 35C and 35D are then formed on the sidewalls of the conductive gate material 38A and 38B as indicated at step 35. Implantation of the S/D 37 is then carried out as indicated at step 41. Thus, when the S/D implant step 41 is completed, we have the structure as illustrated by FIG. 4A.

After completing the S/D implant step 41, disposable spacers 35A, 35B, 35C and 35D are then removed such as by etching as indicated at step 43. The thin permanent spacers 40A, 40B, 40C and 40D are then formed as shown at step 40 and provide larger S/D contact areas. FIG. 4B represents this structure. Then, if desired, step 40 may be followed by the formation of silicide.

Figure 6A:
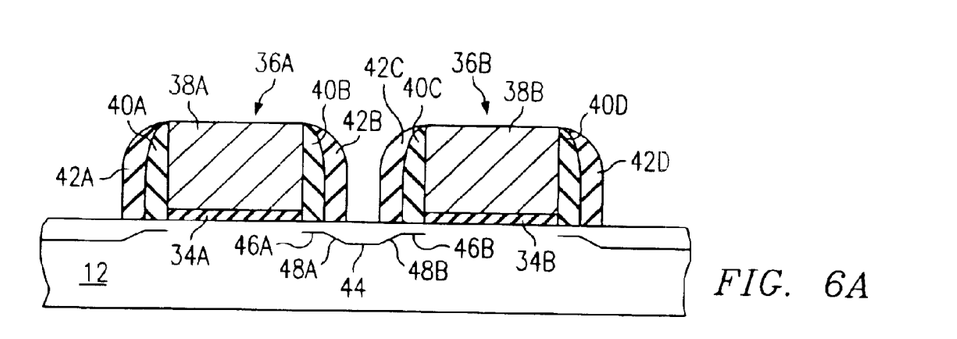
FIGS. 6A and 6B illustrate an embodiment of the present invention using an organic disposal spacer for forming larger Source/Drain contact areas and enhanced graded junctions.
Figure 6B:
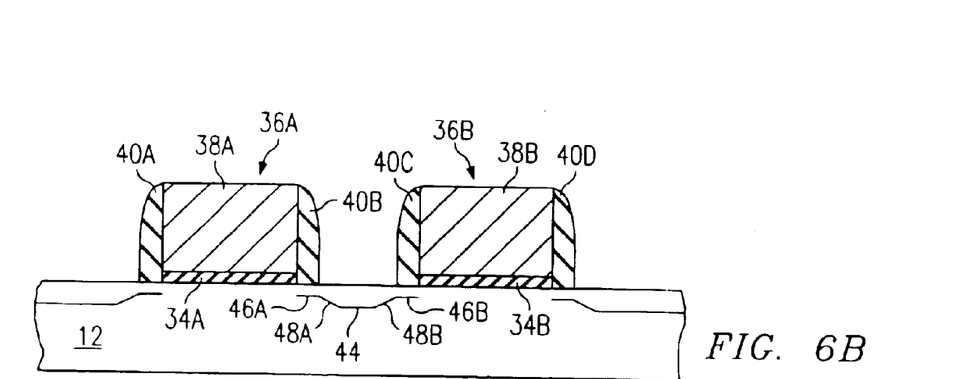

Referring now to FIGS. 6A and 6B, there are illustrated process steps of another embodiment of the invention of using organic spacers as a mask for implanting the S/D areas with enhanced graded junctions. As shown in FIG. 6A, and in a manner similar to that discussed above, a gate dielectric layer such as oxide is deposited over a semiconductor substrate such as a silicon wafer 12. Also, as discussed above, a conductive material 38, such as polysilicon, is then deposited over the gate dielectric. The conductive gate stack is then patterned and etched to define gate structures 36A, 36B. An ion implant is performed to form the LDD/extension areas 46A and 46B.

Methods of forming the gate oxide and the conductive gates 38A and 38B are well-known in the semiconductor art and will not be discussed further. After the conductive gates 38A and 38B have been formed, thinner permanent spacers such as silicon oxide or silicon nitride spacers 40A, 40B, 40C and 40D are formed on the sidewalls of the conductive gate, also according to methods well-known in the prior art. Disposable organic spacers 42A, 42B, 42C and 42D are then formed in a manner similar to that discussed above with respect to FIGS. 2A, 2B and 2C or by any other suitable process. Although the organic spacers 42A–42D may be formed according to any suitable process, the process discussed with respect to FIGS. 2A and 2B is believed to be especially effective. Various and different well-known implantation processes for forming the S/D junction 44 may be used during or after the formation of the organic spacers. The organic spacers act as a mask to block or partially block the S/D implant so as to form an implant profile that has a gradual transition from the LDD/extension areas 46A and 46B to the S/D area 44 than occurs from diffusion alone. These graded junctions are indicated by the sloping lines 48A and 48B and are hereinafter referred to as enhanced graded junctions. The enhanced graded junctions 48A and 48B may be formed by implanting ions when the organic spacers 42A–42D have a common conductive gate thickness of 100 nm–300 nm since the organic spacers only partially block the S/D implant. After the formation of the S/D area 44, and the enhanced graded junctions 48A and 48B, the organic spacers 42A, 42B, 42C and 42D are typically removed to provide larger S/D contact areas as shown in FIG. 6B.

Figure 7:
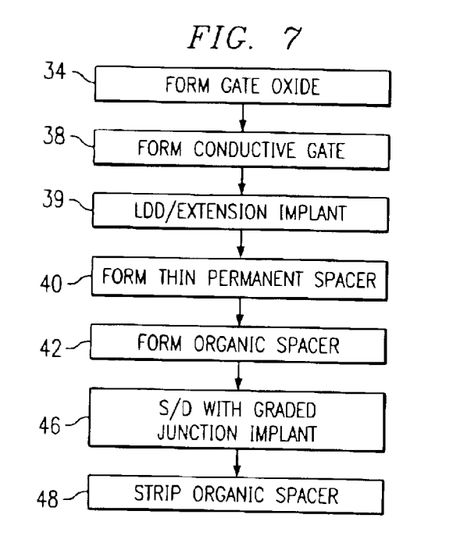
FIG. 7 is a process flow diagram for forming the structures shown in FIGS. 6A and 6B.

Referring to FIG. 7, there is shown a flow diagram for forming the structures of the present invention as shown in FIGS. 6A and 6B. As shown, steps 34, 38 and 39 of FIG. 7 are the same as in FIG. 5. However, after implantation of the LDD/extensions 46A and 46B, the next step of the inventive process of this invention is forming thin dielectric permanent spacers 40A, 40B, 40C and 40D as shown at step 40. Organic spacers 42A, 42B, 42C and 42D are then formed on the permanent spacers as indicated at step 42. Formation of the S/D 44 with enhanced graded junctions 48A and 48B is then accomplished by ion implanting as indicated at step 46. Completion of the ion implanting step 46 results in the structure having enhanced graded junctions 48A and 48B as illustrated in FIG. 6A. Organic spacers 42A, 42B, 42C and 42D are then stripped as shown at step 48 and as illustrated in FIG. 4B. This provides for larger S/D contact areas.

Figure 8A:
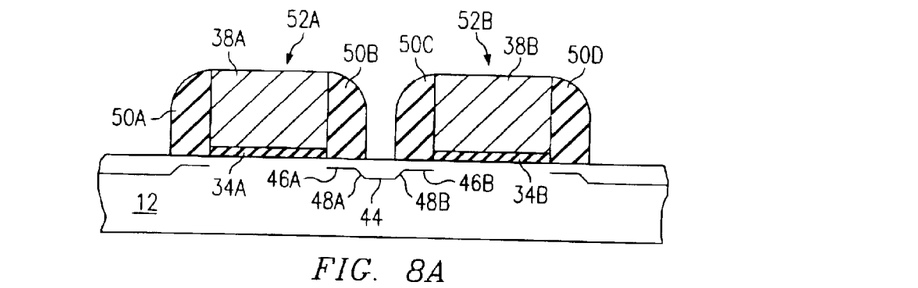
FIGS. 8A and 8B illustrate another embodiment of the present invention of using organic spacers for forming larger Source/Drain contact areas, LDD/extension areas, and enhanced graded junctions in one implant step.
Figure 8B:
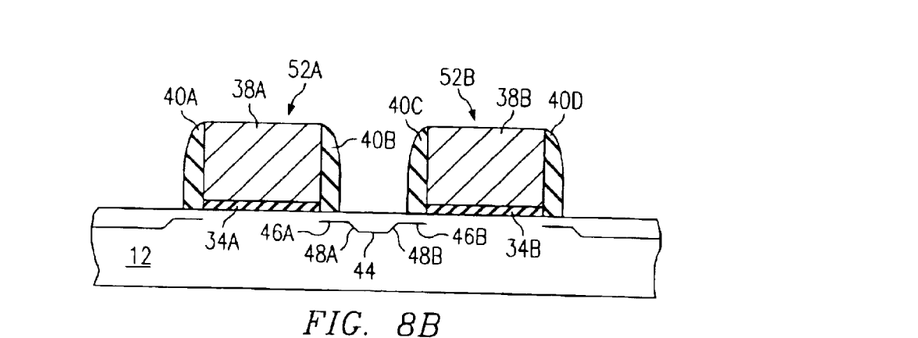

FIGS. 8A and 8B illustrate the process of using the N2 plasma etched according to still another embodiment of this invention to use disposable organic spacers to form S/D areas and LDD/extension areas with enhanced graded junctions, or alternately, to save an LDD/extension implantation step. As shown in FIG. 8A, a patterned semiconductor structure, which includes areas of gate oxide 34A and 34B as part of the conductive gate stacks 52A and 52B is fabricated in a manner as discussed above with respect to the prior art. However, instead of forming oxide or nitride spacers as was discussed with respect to the embodiment of FIGS. 6A and 6B, the disposable organic spacers 50A, 50B, 50C and 50D are then formed in a manner similar to that discussed above with respect to FIGS. 2A, 2B and 2C or by any other suitable process. Although the organic spacers 50A–50D may be formed according to any suitable process, the process discussed with respect to FIGS. 2A and 2B is believed to be especially effective. A single implant step is then carried out to form both S/D areas and LDD/extension areas with enhanced graded junctions. The organic spacer is then removed and thin normal dielectric permanent spacers are formed to allow for larger S/D contact areas. Organic disposable spacers offer an advantage of a low process temperature of about 100° C. compared to over 400° C. for prior art disposable spacers, made of polysilicon, oxide or nitride shown in FIG. 4A and FIG. 4B. As discussed above, organic spacers can be removed by remote plasma ash that is very selective to the device structure. Removal of a polysilicon, oxide or nitride spacer normally requires a wet or dry etch that normally causes damage to the gate oxide or the existing device structures. Besides the advantages of organic disposable spacers as discussed above, an implant step could be saved and enhanced graded junctions could be formed without any additional process steps.

Figure 9:
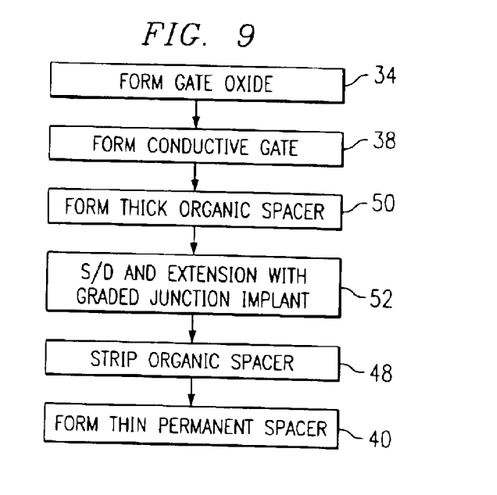
FIG. 9 is a process flow diagram for forming the structures shown in FIGS. 8A and 8B.

FIG. 9 illustrates the process step of this invention for forming the structure illustrated in FIGS. 8A and 8B. Process steps 34 and 38 in the process flow diagram of FIG. 9 are the same as discussed above with respect to FIGS. 5 and 7. However, instead of implanting the LDD/extension regions, thick organic spacers 50A, 50B, 50C and 50D are formed on the sidewalls of the conductive gate material 38A and 38B as indicated at step 50. Although the organic spacers 50A–50D may be formed according to any suitable process, the process discussed with respect to FIGS. 2A and 2B is believed to be especially effective. After formation of the thick organic spacers at step 50, a single ion implantation step 52 may be used to form this S/D region 44 and LDD/extensions 46A and 46B with the enhanced graded junctions 48A and 48B, as illustrated in FIG. 8A. Following the implantation step, organic spacers 50A, 50B, 50C and 50D are stripped away as indicated at step 48. Thin permanent spacers 40A, 40B, 40C and 40D are then formed on the conductive gates to provide for larger S/D contact areas as indicated at step 40 and as illustrated in FIG. 8B. The thin permanent oxide or nitride spacers 40A, 40B, 40C and 40D can be formed by various processes well-known to those skilled in the art.

It should also be noted that in addition to the advantages already discussed, the formation of the organic spacers reduces the thermal budget in the fabrication process. Further, the chemistry and the processes used for stripping or removing the organic spacers is highly selected to polysilicon, nitride and other silicon material such that the stripping process causes minimum impact to the existing semiconductor structure. This of course also increases yield.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, methods and steps described in the specification. As one of ordinary skill in the art will readily appreciate from the disclosure of the present invention, processes, methods, or steps, presently existing or later to be developed, that perform substantially the same function or achieve substantially the same result as the corresponding embodiments described herein may be utilized according to the present invention. Accordingly, the appended claims are intended to include within their scope such processes.

What is claimed is:

1. A method of forming semiconductor features using organic spacers comprising the steps of:
   providing a semiconductor substrate;
   forming a conductive gate member;
   conformally coating said conductive gate member with an organic layer;
   anisotropically etching said coated structure with $N_2$ plasma to form organic spacers; then
   forming Source/Drain areas and a graded junction during a single ion implantation step.

2. The method of claim 1 wherein a portion of said implantation of ions is through said organic spacer such that an LDD/extension area is also formed between the conductive gate and at least one of said Source/Drain areas during said single ion implantation step.

3. The method of claim 2 wherein a graded junction and LDD/extension areas are formed together with Source/Drain areas in a single implantation step.

4. The method of claim 1 further comprising the step of removing said organic spacers.

5. The method of claim 4 further comprising the step of forming a permanent spacer on the side of said conductive gate suitable for receiving an S/D contact.

6. A method of forming semiconductor features using organic spacers comprising the steps of:
   providing a semiconductor substrate having a conductive gate member;
   forming permanent spacers on the sides of said conductive gate member;
   conformally coating said conductive gate member and said permanent spacers structure with an organic layer;
   anisotropically etching said coated structure with $N_2$ plasma to form organic spacers; then
   forming Source/Drain areas and a graded junction during a single ion implantation step.

7. The method of claim 6 wherein LDD/extension areas are formed prior to said step of forming permanent spacers.

8. The method of claim 6 wherein a portion of said implantation of ions is through said organic spacer for forming said graded junction.

9. The method of claim 6 further comprising the step of removing said organic spacers.

10. A method of forming semiconductor features using organic spacers comprising the steps of:
    providing a semiconductor substrate;
    forming a conductive gate member;
    conformally coating said, conductive gate member with an organic layer;
    anisotropically etching said conductive gate member with $N_2$ plasma to form organic spacers; then
    forming Source/Drain areas and an LDD/extension area between the conductive gate and at least one of said Source/Drain areas during a single ion implantation step.

11. The method of claim 10 further comprising the step of removing said organic spacers.

12. The method of claim 11 further comprising the step of forming a permanent spacer on the side of said conductive gate suitable for receiving an S/D contact.

* * * * *